(12) United States Patent
Onishi

(10) Patent No.: US 11,043,842 B2
(45) Date of Patent: Jun. 22, 2021

(54) CONTROL DEVICE, POWER RECEIVING DEVICE, ELECTRONIC DEVICE, CONTACTLESS POWER TRANSMISSION SYSTEM, AND CONTROL METHOD

(71) Applicant: SEIKO EPSON CORPORATION, Tokyo (JP)

(72) Inventor: Kota Onishi, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 249 days.

(21) Appl. No.: 16/361,400

(22) Filed: Mar. 22, 2019

(65) Prior Publication Data

US 2019/0296581 A1    Sep. 26, 2019

(30) Foreign Application Priority Data

Mar. 23, 2018  (JP) .............................. JP2018-055956

(51) Int. Cl.
*H02J 50/10*  (2016.01)
*H02J 7/02*  (2016.01)
(Continued)

(52) U.S. Cl.
CPC ........ *H02J 50/10* (2016.02); *G01R 19/16542* (2013.01); *H01M 10/425* (2013.01);
(Continued)

(58) Field of Classification Search
CPC .......... H02J 50/10; H02J 7/025; H02J 7/0029; H02J 7/0011; H01M 2010/4271; H01M 10/425; G01R 19/16542
(Continued)

(56) References Cited

U.S. PATENT DOCUMENTS 8,026,694 B2 * 9/2011 Kamijo et al. .......... H02J 7/025
                                                              320/108
8,054,036 B2 * 11/2011 Onishi et al. ........... H02J 50/12
                                                              320/108
(Continued)

FOREIGN PATENT DOCUMENTS

JP   2006-164547 A   6/2006
JP   2007-109444 A   4/2007
(Continued)

*Primary Examiner* — Sun J Lin
(74) *Attorney, Agent, or Firm* — Oliff PLC

(57) ABSTRACT

Provided are a control device, a power receiving device, an electronic device, a contactless power transmission system, and a control method capable of preventing an unintentional shutdown release in an electronic device that charges a secondary battery using a contactless power transmission. The control device includes a charging-system circuit that charges a charging subject based on electric power received from a power transmission device, and a discharging-system circuit that supplies power to a processing device based on electric power from the charging subject. The charging-system circuit has a charging-system control circuit that operates based on electric power received by the charging-system circuit. The charging-system control circuit receives a shutdown release notification sent from the power transmission device after the power receiving device is docked to the power transmission device, and based on the shutdown release notification, releases a shutdown state.

12 Claims, 8 Drawing Sheets

(51) Int. Cl.
  *H02J 7/00* (2006.01)
  *H01M 10/42* (2006.01)
  *G01R 19/165* (2006.01)

(52) U.S. Cl.
  CPC .............. *H02J 7/00* (2013.01); *H02J 7/0029* (2013.01); *H02J 7/025* (2013.01); *H01M 2010/4271* (2013.01); *H02J 7/00306* (2020.01)

(58) Field of Classification Search
  USPC ........................................................ 320/108
  See application file for complete search history.

(56) References Cited

U.S. PATENT DOCUMENTS

| | | | |
|---|---|---|---|
| 8,179,089 B2 * | 5/2012 | Shiozaki et al. ..... | H02J 7/00045 320/108 |
| 10,291,082 B2 * | 5/2019 | Onishi ................. | H02J 7/0068 |
| 10,333,348 B2 * | 6/2019 | Onishi .................... | H02J 50/10 |
| 10,601,240 B2 * | 3/2020 | Onishi .................... | H02J 50/80 |
| 10,879,737 B2 * | 12/2020 | Onishi .................... | H02J 50/10 |
| 2006/0119315 A1 | 6/2006 | Sasaki et al. | |
| 2006/0119316 A1 | 6/2006 | Sasaki et al. | |
| 2017/0250560 A1 | 8/2017 | Onishi | |

FOREIGN PATENT DOCUMENTS

| | | | |
|---|---|---|---|
| JP | 2008-148369 A | 6/2008 | |
| JP | 2011-109768 A | 6/2011 | |
| JP | 2012-053999 A | 3/2012 | |
| JP | 2017-153311 A | 8/2017 | |

\* cited by examiner

CONTROL DEVICE, POWER RECEIVING DEVICE, ELECTRONIC DEVICE, CONTACTLESS POWER TRANSMISSION SYSTEM, AND CONTROL METHOD

CROSS REFERENCE

This application claims benefit of Japanese Application JP 2018-055956, filed on Mar. 23, 2018. The disclosure of the prior application is hereby incorporated by reference herein in its entirety.

BACKGROUND

1. Technical Field

The present invention relates to a control device, a power receiving device, an electronic device, a contactless power transmission system, a control method, and the like.

2. Related Art

In recent years, contactless power transmission that utilizes electromagnetic induction and enables power transmission without contact of metal portions has been in the spotlight. An example application of this contactless power transmission is charging of an electronic device incorporating a secondary battery, such as a household appliance or a mobile terminal, for example.

Currently, secondary batteries are used in various devices other than a contactless power transmission system. In a small electronic device, for example, in order to prolong a charging interval or to prevent excessive discharge of the secondary battery, it is desirable to suppress unintentional power consumption of the secondary battery as much as possible. For example, JP-A-2011-109768 discloses technology of a battery pack that includes a secondary battery and a circuit that manages the secondary battery. In JP-A-2011-109768, when a terminal of the battery pack is not connected to a terminal of a charger or an electronic device, a circuit that manages the secondary battery is shut down.

SUMMARY

As described above, a shutdown function is used to reduce discharge of the secondary battery. It is assumed that a circuit that operates with electric power from the secondary battery is set to a shutdown state when shipping or storing an electronic device incorporating the secondary battery, or when excessive discharge of the secondary battery is detected, for example. If the shutdown state is released despite not satisfying an original release condition, a remaining battery amount will be insufficient when using the electronic device, or power will be further discharged from an excessively discharged state of the secondary battery. In an electronic device that charges a secondary battery using contactless power transmission, there is a possibility that the shutdown state will be unintentionally released, for example, by an unnecessary electromagnetic wave being incident on a coil, a sequence of contactless power transmission, or the like.

One aspect of the invention relates to a control device that controls a power receiving device that receives electric power supplied from a power transmission device by contactless power transmission, the control device including: a charging-system circuit that receives electric power supplied from the power transmission device, and charges a charging subject based on the received electric power; and a discharging-system circuit that operates based on electric power from the charging subject, and supplies power to a processing device based on electric power from the charging subject, in which the charging-system circuit has a charging-system control circuit that operates based on electric power received by the charging-system circuit, and the charging-system control circuit is configured to receive a shutdown release notification sent from the power transmission device after the power receiving device is docked to the power transmission device, and based on the shutdown release notification, releases a shutdown state in which discharge from the charging subject is stopped.

Also, in one aspect of the invention, a configuration may be adopted in which the charging-system circuit has a communications circuit that sends authentication information to the power transmission device after the power receiving device is docked to the power transmission device, and the charging-system control circuit receives the shutdown release notification sent after the power transmission device receives the authentication information.

Also, in one aspect of the invention, a configuration may be adopted in which the charging-system control circuit, when a charging start notification sent after the power transmission device receives the authentication information has been received, releases the shutdown state using the charging start notification as the shutdown release notification, and performs control so as to start charging the charging subject.

Also, in one aspect of the invention, a configuration may be adopted in which the charging-system circuit has a measurement circuit that measures a voltage of the charging subject, and the charging-system control circuit releases the shutdown state when the shutdown release notification is received, and also the voltage of the charging subject measured by the measurement circuit is higher than a threshold voltage corresponding to an excessively discharged state.

Also, in one aspect of the invention, a configuration may be adopted in which the discharging-system circuit includes: an excessive discharge detection circuit that detects the excessively discharged state of the charging subject by comparing the voltage of the charging subject with an excessive discharge detection voltage for detecting excessive discharging of the charging subject; and a discharging-system control circuit that operates based on electric power from the charging subject, in which the discharging-system control circuit sets the discharging-system circuit to the shutdown state when the excessive discharge detection circuit has detected the excessively discharged state, and the threshold voltage is a voltage higher than the excessive discharge detection voltage.

Also, in one aspect of the invention, a configuration may be adopted in which the discharging-system circuit includes: an interface circuit that communicates with the processing device; an excessive discharge detection circuit that detects the excessively discharged state of the charging subject by comparing the voltage of the charging subject with an excessive discharge detection voltage; and a discharging-system control circuit that operates based on electric power from the charging subject, in which the discharging-system control circuit sets the discharging-system circuit to the shutdown state when the interface circuit has received a shutdown command from the processing device, or when the charging-system control circuit has received a shutdown command from the power transmission device, or when the excessive discharge detection circuit has detected the excessively discharged state.

Also, another aspect of the invention relates to a control device that controls a power receiving device that receives electric power supplied from a power transmission device by contactless power transmission, the control device including: a charging-system circuit that receives electric power supplied from the power transmission device, and charges a charging subject based on the received electric power; and a discharging-system circuit that operates based on electric power from the charging subject, and supplies power to a processing device based on electric power from the charging subject. The charging-system circuit has a charging-system control circuit that operates based on electric power received by the charging-system circuit during the charging, and a measurement circuit that measures a voltage of the charging subject. The charging-system control circuit, when the voltage of the charging subject measured by the measurement circuit is higher than a threshold voltage corresponding to an excessively discharged state, releases a shutdown state in which discharge from the charging subject is stopped.

Also, in another aspect of the invention, a configuration may be adopted in which the discharging-system circuit includes: an excessive discharge detection circuit that detects the excessively discharged state of the charging subject by comparing the voltage of the charging subject with an excessive discharge detection voltage; and a discharging-system control circuit that operates based on electric power from the charging subject. The discharging-system control circuit sets the discharging-system circuit to the shutdown state when the excessive discharge detection circuit has detected the excessively discharged state, and the threshold voltage is a voltage higher than the excessive discharge detection voltage.

Also, still another aspect of the invention relates to a power receiving device including any control device described above.

Also, still another aspect of the invention relates to an electronic device including any control device described above.

Also, still another aspect of the invention relates to a contactless power transmission system, including: a control device on a power transmission side that controls a power transmission device; and a control device on a power receiving side that controls a power receiving device that receives electric power supplied from the power transmission device by contactless power transmission. The control device on the power receiving side has a charging-system circuit that receives electric power supplied from the power transmission device, and charges a charging subject based on the received electric power, and a discharging-system circuit that operates based on electric power from the charging subject, and supplies power to a processing device based on electric power from the charging subject. The control device on the power transmission side sends a shutdown release notification to the control device on the power receiving side when detected that the power receiving device is docked to the power transmission device, and the control device on the power receiving side, when the shutdown release notification has been received, releases a shutdown state in which discharge from the charging subject is stopped.

Also, still another aspect of the invention relates to a control method of a contactless power transmission system including a control device on a power transmission side that controls a power transmission device, and a control device on a power receiving side that controls a power receiving device that receives electric power supplied from the power transmission device by contactless power transmission, the method including: the control device on the power transmission side sending a shutdown release notification to the control device on the power receiving side when detected that the power receiving device is docked to the power transmission device, the control device on the power receiving side, when the shutdown release notification has been received, releasing a shutdown state in which discharge from the charging subject is stopped, and the control device on the power receiving side receiving electric power supplied from the power transmission device, charging the charging subject based on the received electric power, and supplying power to a processing device based on electric power from the charging subject.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes exemplary embodiments of the invention. Note that the embodiments described below do not unreasonably limit the scope of the invention described in the claims, and not all of the configurations described in these embodiments are necessary to solve problems addressed by the invention.

1. Control Method in Embodiment

Figure 1:
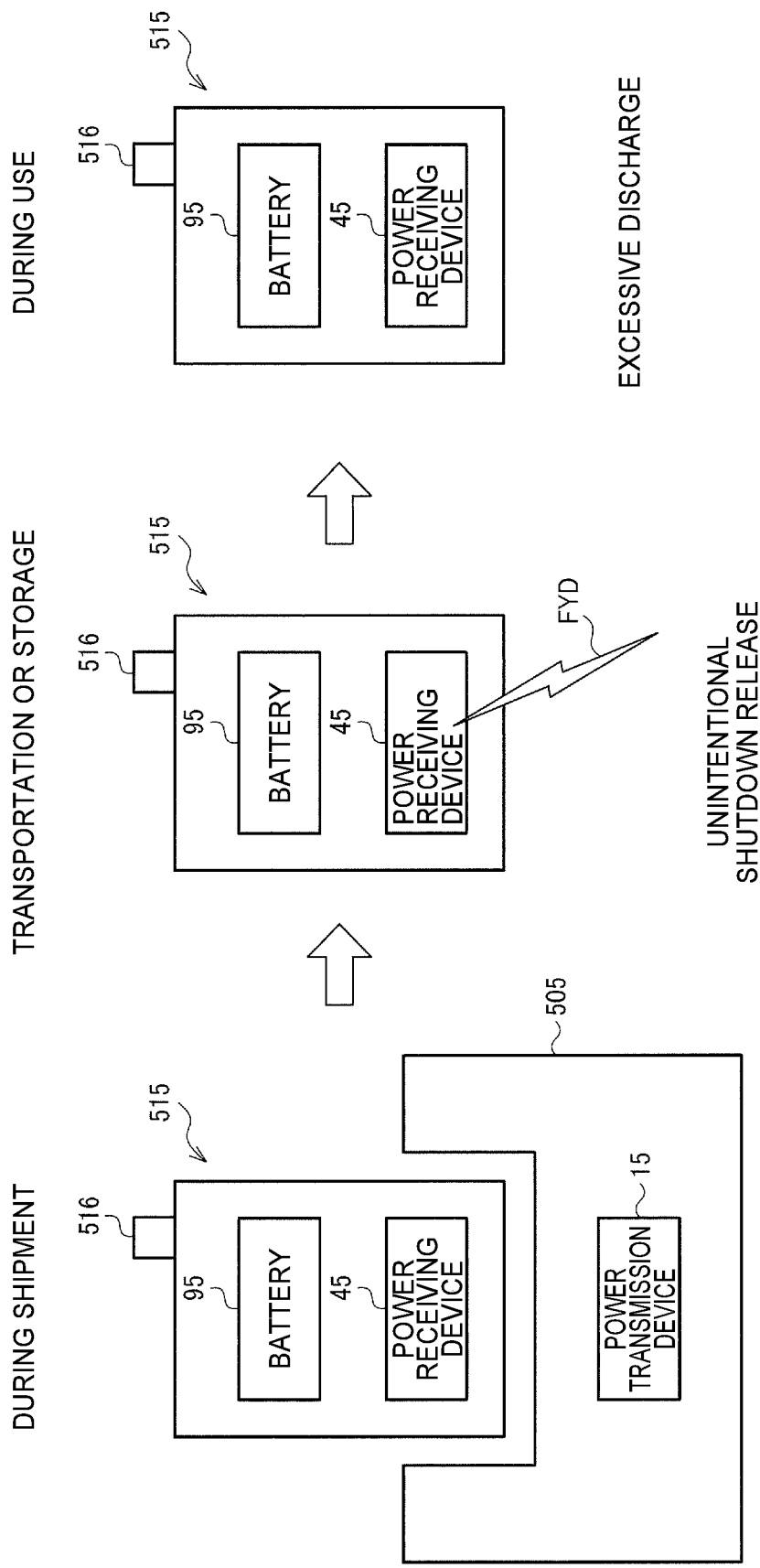
FIG. 1 illustrates unintentional shutdown release of an electronic device incorporating a battery charged by contactless power transmission.

FIG. 1 illustrates unintentional shutdown release of an electronic device 515 incorporating a battery 95 charged by contactless power transmission.

As shown in FIG. 1, when shipping the electronic device 515, the electronic device 515 is set in a shipping charger 505 and the battery 95 of the electronic device 515 is charged. The charger 505 is provided with a power transmission device 15 that transmits power by contactless power transmission. The electronic device 515 includes the battery 95 and a power receiving device 45. The power receiving device 45 receives electric power transmitted from the power transmission device 15, and charges the battery 95 with that electric power. Also, the power receiving device 45 controls power supply from the battery 95 to the power receiving device 45 and the electronic device 515. The power transmission device 15 performs the above-described power transmission, and also transmits an off start command to the power receiving device 45. The off start command is a command for setting the power receiving device 45 to a shutdown state after removal.

When charging of the battery 95 ends, the electronic device 515 is removed from the charger 505, and the power receiving device 45 detects a change from a docked state to a removed state. If the off start command has been received from the power transmission device 15, the power receiving device 45 sets a shutdown state after detecting removal. The shutdown state is a state in which a discharge path of the battery 95 is cut off, for example, a state in which the battery 95 and a circuit where electric power is supplied from the battery 95 are cut off from each other. Note that the technique of setting the power receiving device 45 to the shutdown state at the time of shipping is not limited to this, and for example, the power receiving device 45 may be set to the shutdown state by performing a long press of a switch 516 provided in the electronic device 515.

While transporting or storing the electronic device 515, the shutdown state is maintained. That is, the shutdown state is not released unless a release condition such as power being supplied to the electronic device 515 again is satisfied. However, the power receiving device 45 of the contactless power transmission system receives electric power using electromotive force generated in a coil by electromagnetic induction. Therefore, when an unnecessary electromagnetic wave FYD is incident on the coil during transportation or storage of the electronic device 515, it is possible that electromotive force will be generated in the coil. If the power receiving device 45 receiving electric power has been adopted as a condition for releasing the shutdown state, there is a risk that the shutdown state will be canceled by the electromotive force caused by the electromagnetic wave FYD. Also, there is a risk that the shutdown state will be canceled by the switch 516 pressing against packaging material or the like.

In this manner, in the electronic device 515 in which the battery 95 is charged by contactless power transmission, there is a risk that the shutdown state will be unintentionally released at a time when the shutdown state was not originally intended to be released. For example, when transporting the electronic device 515 by an aircraft, there are regulations regarding the remaining battery amount of the battery 95. Therefore, if discharge of the battery 95 increases due to an unintended shutdown release, a period until reaching excessive discharge of the battery 95 is shortened. For example, if the battery 95 is in an excessively discharged state when using the electronic device 515, there is a risk that it will not be possible to use the battery 95 even if the battery 95 is charged. Particularly in the case of small devices such as wireless earphones and hearing aids, the battery capacity is small, so management of the remaining battery amount is important in consideration of regulations regarding the remaining battery amount.

Figure 2:
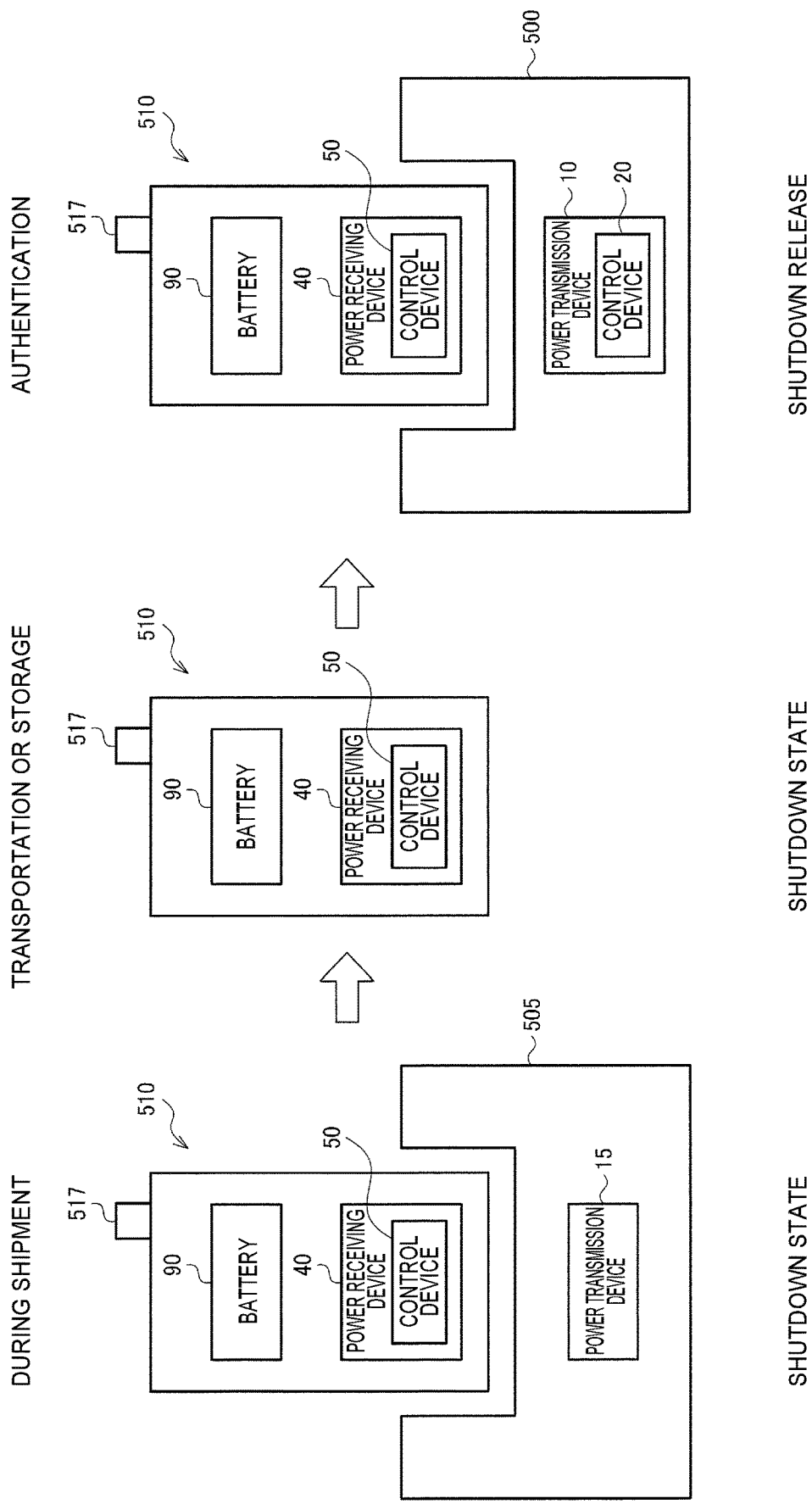
FIG. 2 illustrates a shutdown release technique according to this embodiment.

FIG. 2 illustrates a shutdown release control method according to this embodiment. An electronic device 510 includes a battery 90 subject to charging and a power receiving device 40. The power receiving device 40 includes a control device 50, and the control device 50 receives electric power transmitted from the power transmission device 15 and charges the battery 90 with that electric power. Also, the control device 50 controls power supply from the battery 90 to the power receiving device 40 and the electronic device 510.

Operation at the time of shipping is similar to FIG. 1. That is, the control device 50, by receiving a shutdown command from the power transmission device 15, sets a shutdown state when removal is detected. After transport or storage, a user sets the electronic device 510 in a charger 500. The charger 500 is provided with a power transmission device 10 that transmits power by contactless power transmission. The power transmission device 10 includes a control device 20 that controls the power transmission device 10. The charger 500 is used when the user charges the electronic device 510, and the control device 20 does not send an off start command to the power receiving device 40. Hereinafter, the control device 50 of the power receiving device 40 is also referred to as the control device 50 on the power receiving side. The control device 20 of the power transmission device 10 is also referred to as the control device 20 on the power transmission side.

When the control device 20 on the power transmission side detects that the power receiving device 40 has been docked to the power transmission device 10, the control device 20 sends a shutdown release notification to the control device 50 on the power receiving side. When the control device 50 of the power receiving side receives the shutdown release notification, the control device 50 releases the shutdown state, which is a state where discharge from the battery 90 is stopped. The control device 50 of the power receiving side receives the electric power supplied from the power transmission device 10, charges the battery 90 based on the received electric power, and supplies power to a processing device based on the electric power from the battery 90. The processing device is incorporated into the electronic device 510 and is a device that controls the electronic device 510 and performs various signal processing.

For example, when the control device 50 of the power receiving side detects docking to the power transmission device 10, the control device 50 starts an authentication procedure. The power transmission device 10 sends a shutdown release notification when judged that a correct authentication procedure has been performed. The control device 50 of the power receiving side releases the shutdown state based on that shutdown release notification. In a state where the power receiving device 40 is docked to the power transmission device 10, the control device 50 of the power receiving side turns off power supply to the processing device, and when removal from the power transmission device 10 has been detected, the control receiving device 50 of the power receiving side turns on power supply to the processing device.

According to this embodiment, the shutdown state is released on the condition that the power receiving device 40 has received the shutdown release notification from the power transmission device 10, so the shutdown state is not released unless a shutdown release notification is received. That is, even if an unnecessary electromagnetic wave is incident on the coil of the power receiving device 40 during transport or storage, or a switch 517 is pressed, the shutdown state is not released, and the shutdown state is released for the first time when the user sets the electronic device 510 in the charger 500. Thus the possibility that unintentional shutdown release will occur, and the possibility that the battery 90 will become excessively discharged, can be reduced.

Figure 3:
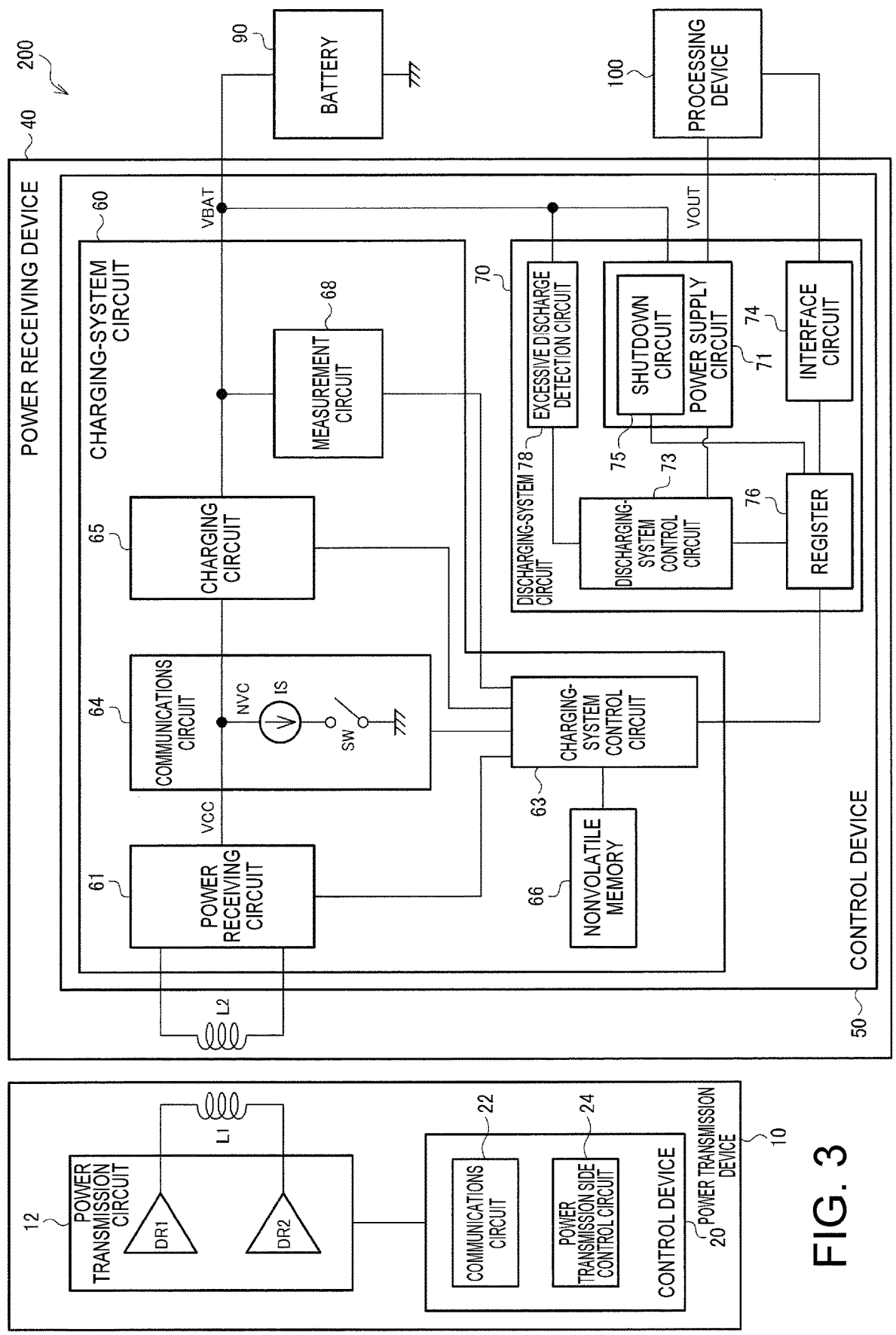
FIG. 3 shows a configuration example of a contactless power transmission system, a power receiving device, and a control device on a power receiving side.

2. Contactless Power Transmission System, Power Receiving Device, and Control Device FIG. 3 shows a configuration example of a contactless power transmission system 200, the power receiving device 40, and the control device 50 on the power receiving side. Also, FIG. 3 shows a configuration example of the power transmission device 10 and the control device 20 on the power transmission side.

The electronic device on the power transmission side in the contactless power transmission system is, for example, the charger 500 in FIG. 2. The electronic transmission device on the power transmission side includes the power transmission device 10 in FIG. 3. The electronic device on the power receiving side in the contactless power transmission system is, for example, the electronic device 510 in FIG. 2. The electronic device on the power receiving side can include the power receiving device 40, the battery 90, and a processing device 100 in FIG. 3. Note that the battery 90 is subject to charging in a broad sense. The power transmission device 10 and the power receiving device 40 constitute the contactless power transmission system 200 of this embodiment.

As the electronic device of the power receiving side, various electronic devices can be assumed, such as a hearing aid, a wrist watch, a biological information measuring device, a portable information terminal, a cordless telephone device, a shaver, an electric toothbrush, a wrist computer, a hand-held terminal, an electric automobile, or an electric bicycle. A biological information measuring device can be assumed to be a wearable device to be used worn on a human body. Also, the portable information terminal is, for example, a smartphone, a mobile telephone, a head-mounted display, or the like.

The power transmission device 10 includes a primary coil L1, a power transmission circuit 12, and the control device 20. The power transmission device 10 is also referred to as a primary side device or a primary side module. The control device 20 is, for example, an integrated circuit device.

The power transmission circuit 12 generates an alternating current voltage of a predetermined frequency during power transmission and supplies this to the primary coil L1. The power transmission circuit 12 includes a power transmission driver DR1 that drives one end of the primary coil L1 and a power transmission driver DR2 that drives the other end of the primary coil L1. Each of the power transmission drivers DR1 and DR2 is a buffer circuit constituted by, for example, a power MOS transistor. Power is transmitted from the primary coil L1 to a secondary coil L2 by the drivers DR1 and DR2 applying alternating current voltage to the primary coil L1.

The primary coil L1 is electromagnetically coupled with the secondary coil L2 to form a power transmission transformer. For example, when power transmission is required, the electronic device on the power receiving side is placed on the charger, establishing a state such that the magnetic flux of the primary coil L1 passes through the secondary coil L2. This is referred to as the docked state, and changing from the removed state to the docked state is called docking. On the other hand, when power transmission is unnecessary, the charger and the electronic device on the power receiving side are physically separated from each other, such that the magnetic flux of the primary coil L1 does not pass through the secondary coil L2. This is called the removed state, and changing from the docked state to the removed state is called removal.

The control device 20 performs various control on the power transmission side. The control device 20 includes a communications circuit 22 and a power transmission side control circuit 24.

The communications circuit 22 performs communications processing between the power transmission device 10 and the power receiving device 40. That is, the communications circuit 22 receives communications data from the power receiving device 40 to the power transmission device 10, and sends communications data from the power transmission device 10 to the power receiving device 40. Communications data is exchanged through a power transmission path. Specifically, when the power receiving device 40 performs load modulation, the amount of current that flows through the primary coil L1 changes, and thus the current that flows to the power supply of the power transmission drivers DR1 and DR2 changes. The communications circuit 22 includes a current-voltage conversion circuit that converts the current into a voltage, and a comparator that compares that voltage with a reference voltage. The power transmission side control circuit 24 acquires communications data based on an output signal of the comparator. Also, the communications circuit 22 changes the driving frequency at which the power transmission circuit 12 drives the primary coil L1 based on the communications data. By detecting this frequency change on the power receiving side, communications data is sent from the power transmission device 10 to the power receiving device 40.

The power transmission side control circuit 24 controls various processing performed by the control device 20. That is, the power transmission side control circuit 24 controls power transmission by the power transmission circuit 12, and controls communications processing by the communications circuit 22. The power transmission side control circuit 24 is configured with a logic circuit.

The power receiving device 40 includes the secondary coil L2 and the control device 50. The power receiving device 40 is also referred to as a secondary side device or a secondary side module. The control device 50 is, for example, an integrated circuit device.

The control device 50 performs various control on the power receiving side. The control device 50 includes a charging-system circuit 60 and a discharging-system circuit 70.

The charging-system circuit 60 is a circuit operated by electric power received by a power receiving circuit 61, and operates while the power receiving circuit 61 is receiving power and during charging of the battery 90. That is, each part of the charging-system circuit 60 operates based on a rectified voltage VCC, or based on a voltage obtained by regulating the rectified voltage VCC. The charging-system circuit 60 receives electric power supplied from the power transmission device 10 and charges the battery 90 based on the received electric power. The charging-system circuit 60 includes the power receiving circuit 61, a charging-system control circuit 63, a communications circuit 64, a charging circuit 65, a nonvolatile memory 66, an interface circuit 67, and a measurement circuit 68.

The discharging-system circuit 70 is a circuit operated by power supplied from the battery 90, and performs power supply to the processing apparatus 100 based on electric power from the battery 90. Each part of the discharging-system circuit 70 operates based on a battery voltage VBAT. Also, in the discharging-system circuit 70, in the shutdown state, the power supply from the battery 90 is cut off and operation is stopped. The discharging-system circuit 70 includes a power supply circuit 71, a discharging-system control circuit 73, an interface circuit 74, a register 76, and an excessive discharge detection circuit 78.

The power receiving circuit 61 receives electric power from the power transmission device 10. Specifically, the power receiving circuit 61 converts alternating current induced voltage of the secondary coil L2 into the direct current rectified voltage VCC. This conversion is performed by a rectifying circuit of the power receiving circuit 61. The rectifying circuit can be realized by, for example, a plurality of transistors, diodes, and the like.

The charging-system control circuit 63 controls the power receiving circuit 61, the communications circuit 64, the charging circuit 65, and the nonvolatile memory 66, and executes various control processing performed during charging of the battery 90. Also, the charging-system control circuit 63 performs receiving processing to receive communications data sent from the power transmission device 10. The power receiving circuit 61 has a comparator that converts the alternating current induced voltage of the secondary coil L2 into a rectangular wave signal. As described above, the power transmission device 10 changes the frequency of the alternating current voltage that drives the primary coil L1 based on communications data. The charging-system circuit 60 measures the frequency of the rectangular wave signal using a counter or the like, for example, and receives communications data based on a result of that measurement. The charging-system control circuit 63 can be realized by various processors such as a logic circuit generated by an automatic placement and routing method such as a gate array, or a DSP (Digital Signal Processor), for example.

The communications circuit 64 performs load modulation for sending communications data to the power transmission device 10. Note that the communications circuit 64 is also referred to as a load modulation circuit. The communications circuit 64 has a current source IS and a switch SW. The current source IS allows a constant current to flow from a node NVC of the rectified voltage VCC to a ground node. The switch SW is configured with a transistor. The current source IS and the switch SW are provided in series between the node NVC of the rectified voltage VCC and the ground node. Based on the control signal from the charging-system control circuit 63, the switch SW is turned on or off to turn on or off the constant current that flows from the node NVC to the ground node. The control signal is a signal corresponding to communications data. The load seen from the power transmission circuit 12 differs between when the constant current is on and when the constant current is off. Communications from the power receiving device 40 to the power transmission device 10 are realized by the communications circuit 22 on the power transmission side detecting this load difference with the technique described above.

The charging circuit 65 performs charging and control of the battery 90. The charging circuit 65 charges the battery 90 based on the electric power received by the power receiving circuit 61. That is, the charging circuit 65 charges the battery 90 by generating a constant current based on the rectified voltage VCC and supplying the constant current to the terminal of the battery 90.

The measurement circuit 68 is a circuit that measures the battery voltage VBAT, which is the terminal voltage of the battery 90. For example, the measurement circuit 68 is configured with an A/D conversion circuit, or is configured with a comparator that compares the battery voltage VBAT with a reference voltage. The measurement circuit 68 outputs the measurement result to the charging-system control circuit 63, and the charging-system control circuit 63 performs control based on the measurement result. As will be described later, the charging-system control circuit 63 performs control to release the shutdown state of the discharging-system circuit 70. Specifically, the charging-system control circuit 63 releases the shutdown state of the discharging-system circuit 70 when a shutdown release notification is received from the power transmission device 10, and when the battery voltage VBAT is higher than a given voltage. For example, the charging-system control circuit 63 releases the shutdown state by writing a register value of shutdown release in the register 76 of the discharging-system circuit 70.

The nonvolatile memory 66 is a nonvolatile memory device that stores various information. This nonvolatile memory 66 stores various information such as status information of the power receiving device 40, for example. As the nonvolatile memory 66, for example, an EEPROM or the like can be used. As the EEPROM, for example, a MONOS (Metal Oxide Nitride Oxide Silicon) type memory or a floating gate type memory can be used.

The power supply circuit 71 supplies power to the processing apparatus 100. That is, the power supply circuit 71 excites a discharging operation of the battery 90 and supplies the electric power from the battery 90 to the processing device 100. The power supply circuit 71 converts the battery voltage VBAT to an output voltage VOUT and supplies the output voltage VOUT to the processing device 100. Also, the power supply circuit 71 regulates the battery voltage VBAT and generates the power source for the discharging-system control circuit 73, the interface circuit 74, and the excessive discharge detection circuit 78. The power supply circuit 71 includes a shutdown circuit 75 for cutting off the discharge path from the battery 90. When the shutdown state has been set, the shutdown circuit 75 cuts off the power supply path from the node of the battery voltage VBAT to each part of the discharging-system circuit 70 and the processing device 100. The power supply circuit 71 can be configured with, for example, a charge pump circuit, a switching regulator, a linear regulator, or the like. The shutdown circuit 75 is, for example, a switch configured with a transistor or the like.

The discharging-system control circuit 73 executes various control processing performed during discharge of the battery 90. The discharging-system control circuit 73 controls the power supply circuit 71, the interface circuit 74, and the excessive discharge detection circuit 78. The discharging-system control circuit 73 sets the discharging-system circuit 70 to the shutdown state when a shutdown command is received from the processing device 100, when excessive discharge of the battery 90 is detected, and when shutdown is instructed by operation of the switch 517. For example, the discharging-system control circuit 73 sets the shutdown state by writing a register value that instructs shut down in the register 76. The discharging-system control circuit 73 can be realized by various processors such as a logic circuit generated by an automatic placement and routing method such as a gate array, or a DSP (Digital Signal Processor), for example.

The interface circuit 74 is an interface used for sending and receiving information between the processing device 100 and the control device 50. The information transmitted or received is, for example, data, a command, or the like. As the interface circuit 74, circuits of various interface systems can be adopted, and it is possible to adopt, for example, an interface circuit of an SPI (Serial Peripheral Interface) system or an I2C (Inter Integrated Circuit) system. Also, the interface circuit 74 may include an interrupt circuit that sends an interrupt signal to the processing device 100.

The excessive discharge detection circuit 78 detects the excessive discharge of the battery 90. Specifically, the excessive discharge detection circuit 78 monitors the battery voltage VBAT, determines that the battery 90 is in an excessively discharged state when the battery voltage VBAT is lower than an excessive discharge detection voltage, and outputs the determination result to the discharging-system control circuit 73. The excessive discharge detection circuit 78 is, for example, a comparator that compares the battery voltage VBAT with an excessive discharge detection voltage. The excessive discharge detection voltage is a reference voltage for detecting excessive discharge.

The battery 90 is, for example, a chargeable secondary battery, and is a lithium battery, a nickel battery, or the like, for example. The lithium battery is a lithium ion secondary battery, a lithium ion polymer secondary battery, or the like. The nickel battery is a nickel-hydrogen storage battery, a nickel-cadmium storage battery, or the like.

The processing device 100 is provided in an electronic device incorporating the power receiving device 40, and is a power supply target to which electric power is supplied from the battery 90. The processing device 100 is, for example, an integrated circuit device or the like, and is, for example, a processor such as a DSP, a microprocessor, a microcontroller, or a CPU.

Figure 4:
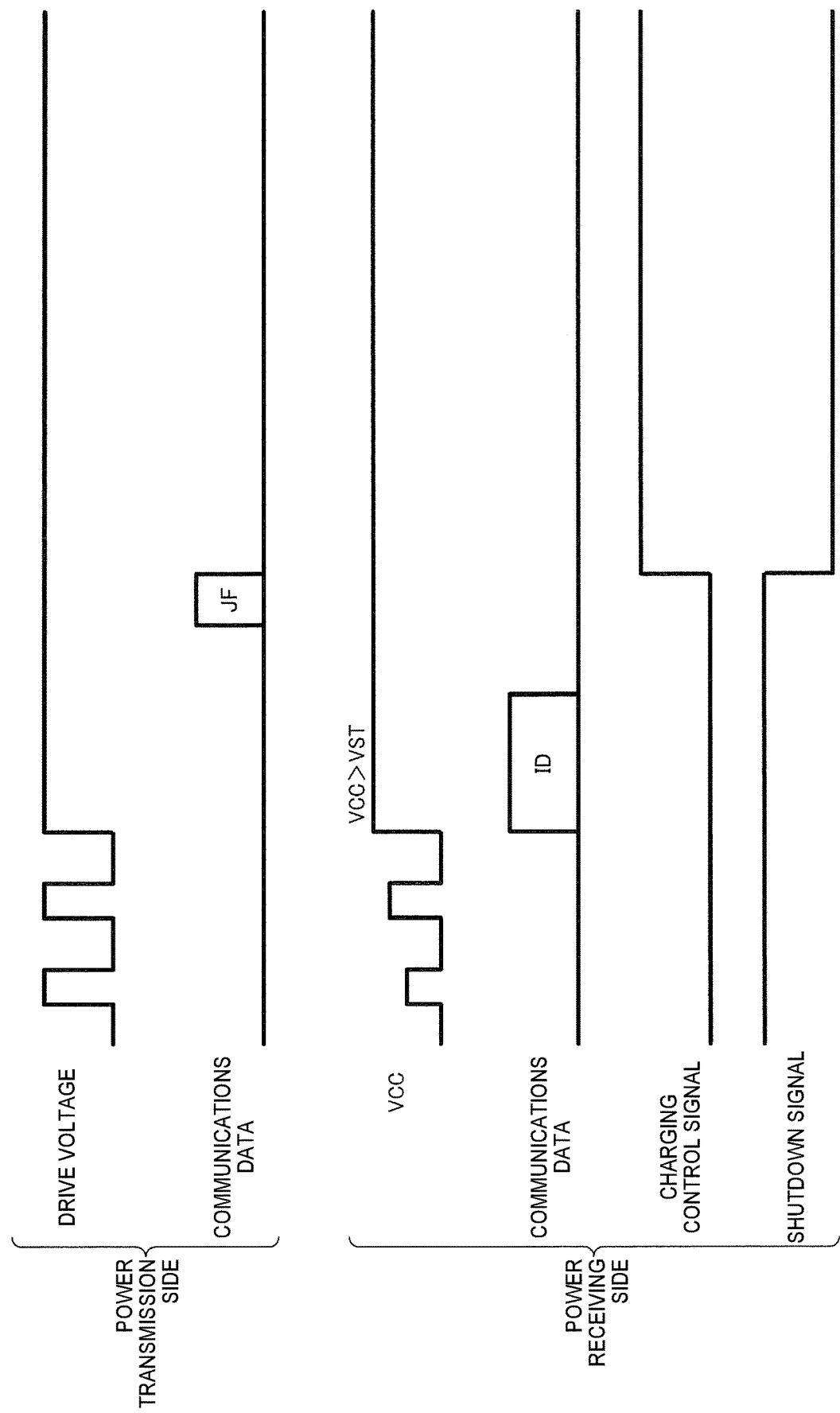
FIG. 4 is a first timing chart illustrating a first operation example of the contactless power transmission system.

FIG. 4 is a first timing chart illustrating a first operation example of the contactless power transmission system 200.

A drive voltage is the amplitude of the alternating current voltage at which the power transmission circuit 12 drives the primary coil L1. When the power receiving device 40 is not docked to the power transmission device 10, the power transmission device 10 and the power receiving device 40 are performing docking detection. At this time, the power transmission circuit 12 is intermittently driving the primary coil L1. In order to dock the power receiving device 40 to the power transmission device 10, as the primary coil L1 and the secondary coil L2 approach each other, the rectified voltage VCC output by the power receiving circuit 61 rises. The rectified voltage VCC is intermittently generated in accordance with the intermittent power transmission by the power transmission circuit 12.

The charging-system circuit 60 has an A/D conversion circuit that performs A/D conversion of the rectified voltage VCC, and the charging-system control circuit 63 causes the communications circuit 64 to begin load modulation when the rectified voltage VCC exceeds a docking detection voltage VST. When the communications circuit 22 of the power transmission device 10 detects load modulation, the power transmission side control circuit 24 causes the power transmission circuit 12 to start continuous power transmission. The charging-system control circuit 63 causes an authentication information ID to be sent to the power transmission device 10 by load modulation. The authentication information ID is information for requesting the control device 20 on the power transmission side to authenticate the control device 50 on the power receiving side, and is, for example, identification data. The power transmission side control circuit 24 performs authentication processing of the authentication information ID, and when the control device 50 of the power receiving side has been authenticated, the power transmission side control circuit 24 causes a shutdown release notification JF to be sent from the communications circuit 22 to the power receiving device 40. Note that the charging-system control circuit 63 may repeatedly send the authentication information ID, and the power transmission side control circuit 24 may send the shutdown release notification JF when reception of the authentication information ID has been confirmed a plurality of times.

Note that the A/D conversion circuit that performs A/D conversion of the rectified voltage VCG may be an A/D conversion circuit shared with the measurement circuit 68.

The charging-system control circuit 63 activates a charging control signal when the shutdown release notification JF has been received. For example, in FIG. 4, the high level corresponds to the active state. The charging circuit 65 charges the battery 90 when the charging control signal is active. Also, the charging-system control circuit 63 outputs a shutdown signal, and the register 76 holds the shutdown signal. In the example in FIG. 4, the high level shutdown signal represents the shutdown state, and the low level shutdown signal represents a shutdown release state.

According to the above embodiment, the charging-system control circuit 63 receives the shutdown release notification sent from the power transmission device 10 after the power receiving device 40 is docked to the power transmission device 10. Then, based on the received shutdown release notification, the charging-system control circuit 63 releases the shutdown state, which is a state in which discharge from the battery 90 (the charging subject) is stopped.

According to this embodiment, the shutdown state is released on the condition that the power receiving device 40 has received the shutdown release notification from the power transmission device 10. Thus, the shutdown state is not released unless the electronic device on the power receiving side is set in the charger and the power receiving device 40 receives a shutdown release notification. That is, the possibility that the battery 90 will become excessively discharged during transport or storage of the electronic device can be reduced.

For example, in a contact type charging-system, the shutdown state may be released on the condition that a predetermined voltage has been input to a charging circuit that charges a battery. If this example is hypothetically applied to this embodiment, the shutdown state is released on the condition that the rectified voltage VCC has reached the predetermined voltage. However, as illustrated in FIG. 1, when an electromagnetic wave is incident on the secondary coil L2 from an electromagnetic wave generation source other than the primary coil L1, there is a risk that the rectified voltage VCC will rise and the shutdown state will be released. According to this embodiment, receiving of the shutdown release notification is a condition, so the shutdown state is not released even if the rectified voltage VCC rises.

Also, in this embodiment, the communications circuit 64 sends the authentication information ID to the power transmission device 10 after the power receiving device 40 has been docked to the power transmission device 10. The charging-system control circuit 63 receives the shutdown release notification sent by the power transmission device 10 that has received the authentication information ID. The shutdown release notification is a notification sent by the power transmission device 10 as a response to the authentication information ID.

According to this embodiment, the shutdown state can be released on the condition that authentication processing has been performed between the power receiving device 40 and the power transmission device 10. Specifically, the power transmission device 10 authenticates the power receiving device 40 based on the authentication information ID, sends a shutdown release notification to the power receiving device 40 as a result of the authentication, and the power receiving device 40 receives the shutdown release notification, thereby releasing the shutdown state. Therefore, the shutdown state is not released unless the electronic device incorporating the power receiving device 40 is set in the charger incorporating the power transmission device 10, and authentication has been performed.

Note that the shutdown release notification is not required to be information that instructs the shutdown release itself. That is, among a series of information exchanged in the authentication processing, information sent from the power transmission device 10 to the power receiving device 40 may be used as the shutdown release notification.

For example, the charging-system control circuit 63, when a charging start notification sent by the power transmission device 10 that has received the authentication information has been received, releases the shutdown state using the charging start notification as the shutdown release notification, and performs control so as to start charging the battery 90. The charging start notification is a notification sent by the power transmission device 10 as a response to the authentication information ID. The shutdown release notification JF in FIG. 4 is a charging start notification. When the shutdown release notification JF has been received, the charging-system control circuit 63 changes the charging control signal from inactive to active, thereby causing the charging circuit 65 to start charging, and releases the shutdown state, which is a state in which discharge from the battery 90 is stopped.

By adopting such a configuration, when the power transmission device 10 has authenticated the power receiving device 40, a charging start notification that the power transmission device 10 sends to the power receiving device 40 can be used also as a shutdown release notification. The charging start notification is also a notification indicating that authentication has ended, so the shutdown state can be released on the condition of authentication.

3. Second Operation Example and Third Operation Example

Figure 5:
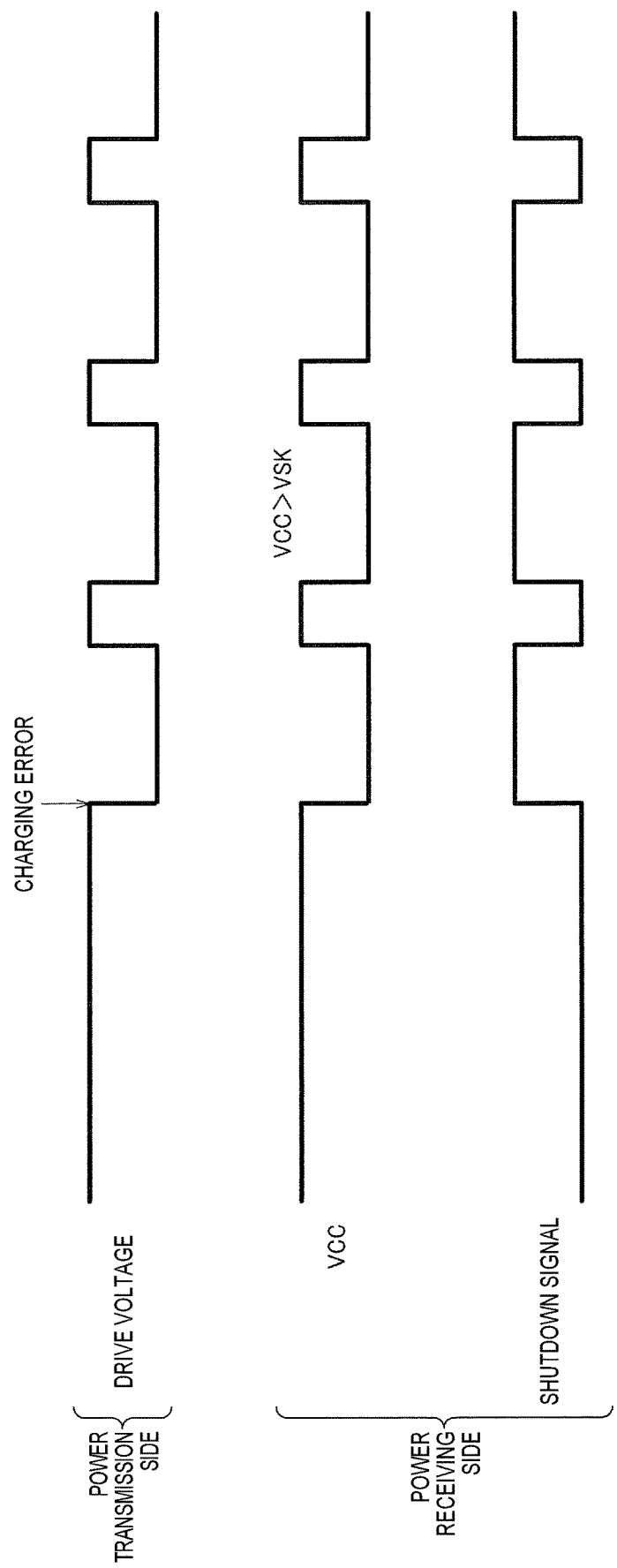
FIG. 5 is a timing chart illustrating a state in which the battery is further discharged despite being in an excessively discharged state.

FIG. 5 is a timing chart illustrating a state in which the battery 90 is further discharged despite being in an excessively discharged state. FIG. 5 does not show operation of this embodiment, but shows operation in a hypothetical case where the shutdown state has been released on the condition of a voltage value of the rectified voltage VCC.

When the power receiving device 40 detects, for example, an excessive charging current or a terminal short circuit of the battery 90, the power receiving device 40 stops charging of the battery 90 and notifies the power transmission device 10 of the charging error by load modulation. When the power transmission device 10 receives notification of the charging error, the power transmission device 10 changes from continuous power transmission to removal detection. In the removal detection, the power transmission device 10 performs intermittent power transmission. In the intermittent power transmission, a power transmission period and a non-power transmission period are repeated. In the power transmission period, the rectified voltage VCC output by the power receiving circuit 61 primarily rises. Hypothetically, if the shutdown state is released on the condition that the rectified voltage VCC exceeds a determination voltage VSK, when VCC>VSK in the power transmission period, the shutdown signal becomes a low level signal and shutdown release occurs. In the non-power transmission period, because VCC<VSK, the shutdown signal again becomes a high level signal so the shutdown state is established, and while removal detection is being performed, shutdown release and the shutdown state are repeated. When the shutdown state is released during the power transmission period of intermittent power transmission, discharge from the battery 90 is permitted, so the battery 90 is in a state where discharging is repeated. When the battery 90 repeatedly discharges, there is a risk that the battery 90 will become excessively discharged, but when shutdown release is repeated by intermittent power transmission, discharging further progresses from an excessively discharged state.

Figure 6:
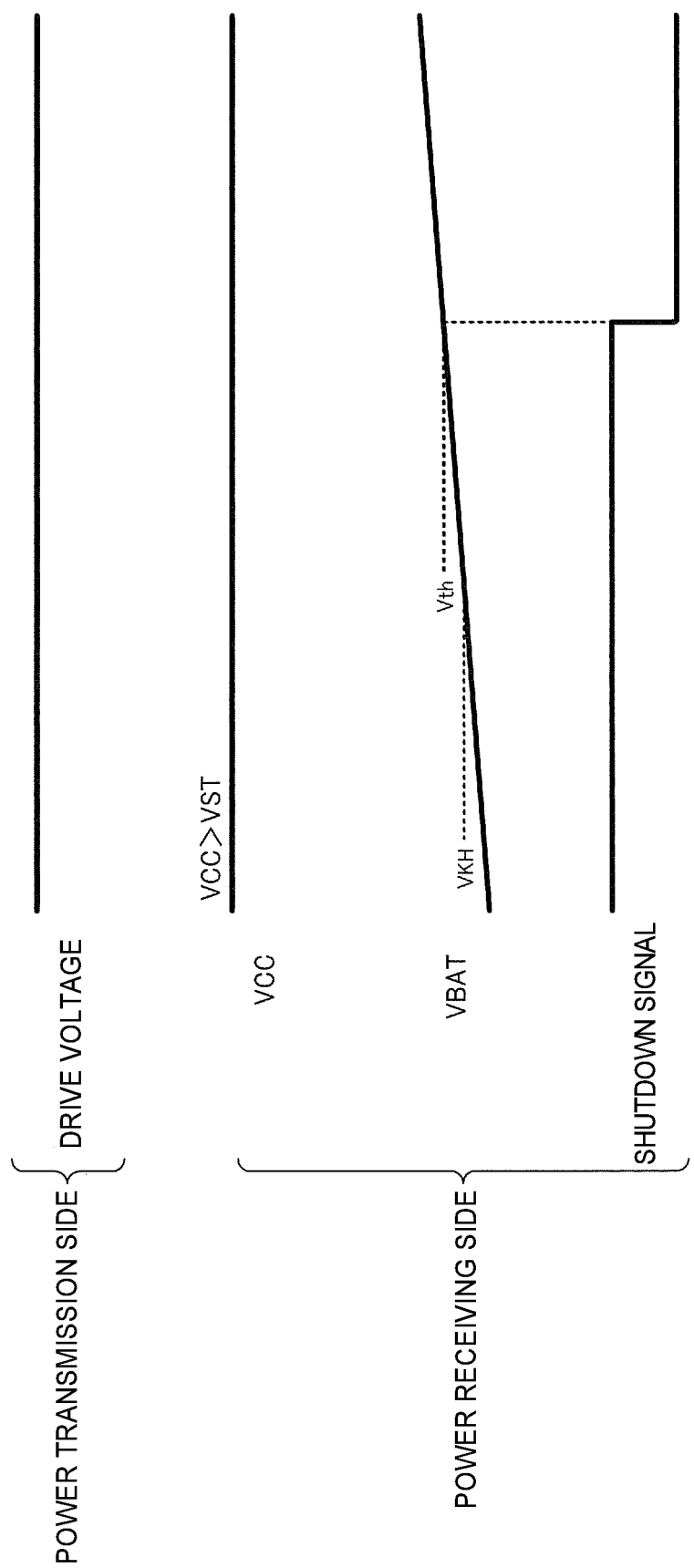
FIG. 6 is a third timing chart illustrating a second operation example of the contactless power transmission system.

FIG. 6 is a second timing chart illustrating a second operation example of the contactless power transmission system 200.

As shown in FIG. 6, it is assumed that the rectified voltage VCC exceeds the docking detection voltage VST, and the power transmission device 10 is performing continuous power transmission. It is assumed that the battery voltage VBAT starts from a state lower than an excessive discharge detection voltage VKH and the shutdown signal is a high level signal that instructs shutdown.

In this embodiment, the shutdown state is not released on the condition of the voltage value of the rectified voltage VCC, but is released on the condition of the voltage value of the battery voltage VBAT. Specifically, the charging circuit 65 charges the battery 90 based on the electric power supplied by continuous power transmission, so the battery voltage VBAT gradually increases. The measurement circuit 68 compares the battery voltage VBAT with a threshold voltage Vth and outputs the comparison result to the charging-system control circuit 63. The charging-system control circuit 63 changes the shut down signal from a high level signal to a low level signal when determined that the battery voltage VBAT is higher than the threshold voltage Vth. The threshold voltage Vth is a voltage corresponding to an excessively discharged state of the battery 90, and is a voltage indicating that the battery 90 has left the excessively discharged state. When the low level shutdown signal is held in the register 76, the shutdown circuit 75 releases the shutdown state.

According to this embodiment, the charging-system control circuit 63 releases the shutdown state when the battery voltage VBAT measured by the measurement circuit 68 is higher than the threshold voltage Vth. Therefore, the shutdown state is not released merely by the power receiving device 40 receiving electric power from the power transmission device 10 by intermittent power transmission or continuous power transmission. Therefore, it is possible to prevent a circumstance where the battery 90 in an excessively discharged state as illustrated in FIG. 5 performs further discharge.

In this embodiment, the excessive discharge detection circuit 78 detects an excessively discharged state of the battery 90 by comparing the battery voltage VBAT (the voltage to be charged) with the excessive discharge detection voltage VKH for detecting excessive discharge of the battery 90 (the charging subject). The discharging-system control circuit 73 sets the discharging-system circuit 70 to the shutdown state when the excessive discharge detection circuit 78 has detected an excessively discharged state. At this time, the threshold voltage Vth is higher than the excessive discharge detection voltage VKH.

By adopting such a configuration, hysteresis can be introduced between the condition of excessive discharge detection and the condition of shutdown release. That is, when the battery voltage VBAT decreases, excessive discharge is detected if the battery voltage VBAT falls below the excessive discharge detection voltage VKH, and VKH<Vth, so the shutdown state is set. On the other hand, when the battery voltage VBAT increases, the shutdown state is released when the battery voltage VBAT exceeds the threshold voltage Vth, where Vth>VKH.

Note that, after the battery voltage VBAT exceeds the threshold voltage Vth, if the battery voltage VBAT again falls below the excessive discharge detection voltage VKH despite charging the battery 90, the discharging-system control circuit 73 determines that a battery error has occurred. When this battery error occurs, the discharging-system control circuit 73 sets the shutdown state, and thereafter does not release the shutdown state.

Figure 7:
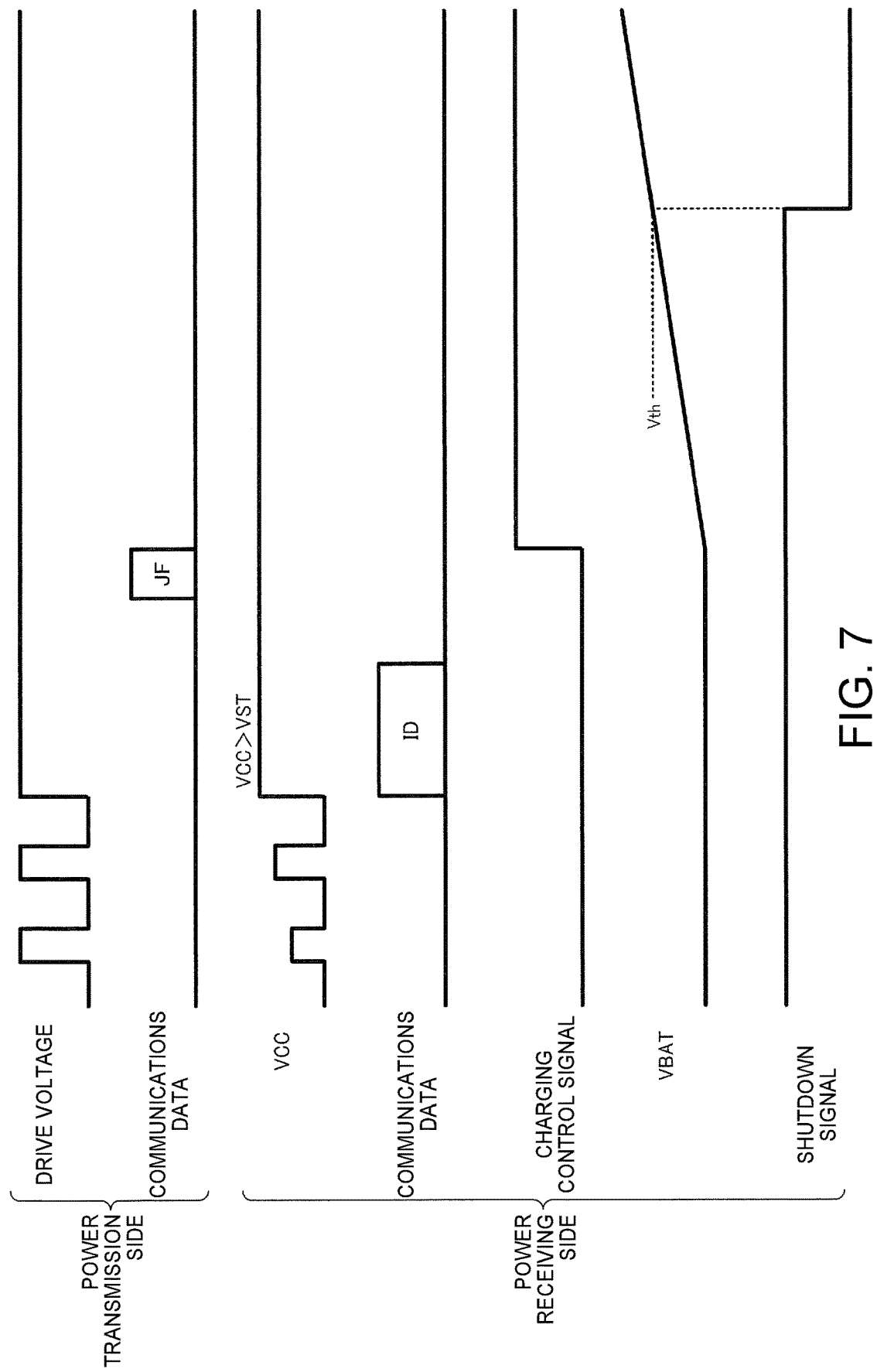
FIG. 7 is a third timing chart illustrating a third operation example of the contactless power transmission system.

FIG. 7 is a third timing chart illustrating a third operation example of the contactless power transmission system 200. Operation up until docking is detected and the power transmission device 10 sends the shutdown release notification JF (the charging start notification) to the power receiving device 40 is the same as that in the first operation example.

In the third operation example, the charging-system control circuit 63 releases the shutdown state when the shutdown release notification JF has been received, and also the battery voltage VBAT measured by the measurement circuit 68 is higher than the threshold voltage Vth. That is, the charging-system control circuit 63, when the shutdown release notification JF has been received from the power transmission device 10, activates a charging-system control signal and causes the charging circuit 65 to start charging the battery 90. At this time, when the battery voltage VBAT is lower than the threshold voltage Vth, the charging-system control circuit 63 maintains the shutdown signal as the high level signal that instructs the shutdown state. When the battery voltage VBAT becomes higher than the threshold voltage Vth, the charging-system control circuit 63 changes the shutdown signal to a low level signal that instructs shutdown release.

According to this embodiment, when the power receiving device 40 is authenticated by the power transmission device 10, and also it is confirmed that the battery 90 has left the excessively discharged state, the shutdown state can be released. The shutdown state is not released when any condition is not satisfied, so the shutdown state can be managed more reliably. That is, it is possible to maintain the shutdown state while transporting or storing the electronic device on the power receiving side, and possible to prevent the battery 90 from further discharging from an excessively discharged state.

In this embodiment, the discharging-system circuit 70 has the interface circuit 74 that communicates with the processing device 100. The discharging-system control circuit 73 sets the discharging-system circuit 70 to the shutdown state when the interface circuit 74 has received a shutdown command from the processing device 100. For example, when the processing device 100 detects any error such as a battery malfunction, the processing device 100 issues a shutdown command to the control device 50 on the power receiving side, and writes a register value that instructs shutdown to the register 76 through the interface circuit 74. Also, the discharging-system control circuit 73 sets the discharging-system circuit 70 to the shutdown state when the charging-system control circuit 63 has received a shutdown command from the power transmission device 10. When the charging-system control circuit 63 receives the shutdown command, the charging-system control circuit 63 writes a register value that instructs shutdown to the register 76. Also, the discharging-system control circuit 73 sets the discharging-system circuit 70 to the shutdown state when the excessive discharge detection circuit 78 has detected an excessively discharged state.

According to this embodiment, the shutdown state is set by satisfying any of a plurality of conditions. In this embodiment, when the charging-system control circuit 63 receives the shutdown release notification JF, and also the battery voltage VBAT measured by the measurement circuit 68 is higher than the threshold voltage Vth, the shutdown state that was set on the above conditions is released. Therefore, it is possible to avoid an unintended shutdown release regardless of the conditions on which the shutdown state was set. Also, it is possible to avoid further discharge of the battery 90 from an excessively discharged state.

Figure 8:
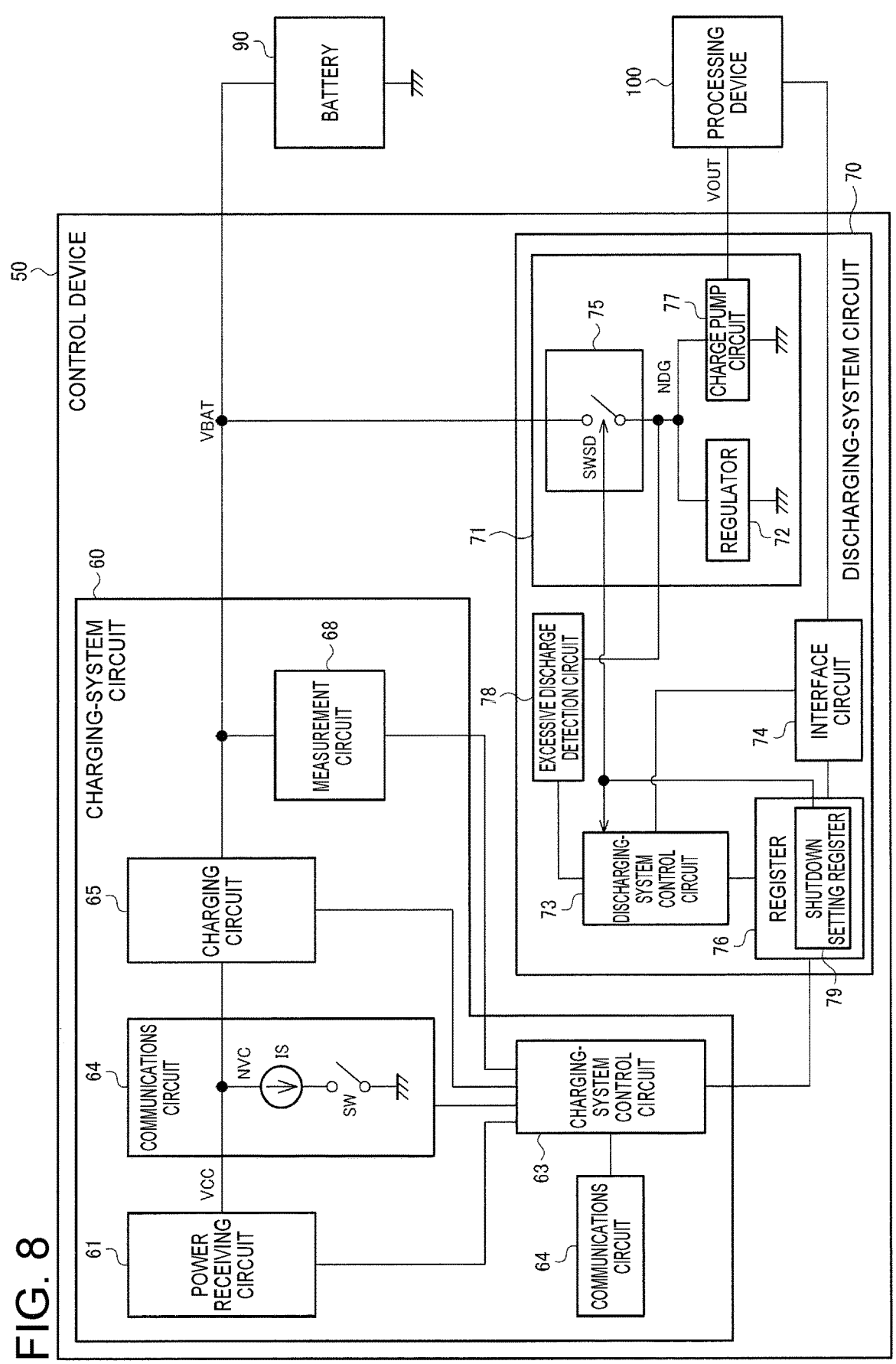
FIG. 8 is a detailed configuration example of the control device on the power receiving side, a discharging-system circuit, a power supply circuit, and a shutdown circuit.

4. Control Device on Power Receiving Side, Discharging-System Circuit, Power Supply Circuit, and Shutdown Circuit FIG. 8 is a detailed configuration example of the control device 50 on the power receiving side, the discharging-system circuit 70, the power supply circuit 71, and the shutdown circuit 75. Note that the same reference signs are assigned to the same constituent elements as the constituent elements described with reference to FIG. 3, and a description of those constituent elements is omitted as appropriate.

In FIG. 8, the power supply circuit 71 includes the shutdown circuit 75, a regulator 72, and a charge pump circuit 77. The shutdown circuit 75 also includes a switch SWSD. The switch SWSD is configured with a transistor. Also, the register 76 includes a shutdown setting register 79.

The switch SWSD is connected between the node of the battery voltage VBAT and a node NDG, and controlled to be on or off by a register value of the shutdown setting register 79. The node NDG is a power source node of the regulator 72, the charge pump circuit 77, and the excessive discharge detection circuit 78. When the switch SWSD is on, the regulator 72 generates power to be supplied to, for example, an unshown oscillation circuit based on the battery voltage VBAT. The unshown oscillation circuit is a circuit that generates an operation clock of the discharging-system control circuit 73. When the switch SWSD is on, the battery voltage VBAT is supplied to the excessive discharge detection circuit 78. Also, when the switch SWSD is on, and also operation to supply power to the processing device 100 is on, the charge pump circuit 77 provides the output voltage VOUT to the processing device 100 based on the battery voltage VBAT.

When setting the shutdown state, the charging-system control circuit 63 and the discharging-system control circuit 73 write a register value that instructs shutdown to the shutdown setting register 79. When this register value is set, the switch SWSD is switched off. When the switch SWSD is switched off, supply of the battery voltage VBAT to the excessive discharge detection circuit 78, the regulator 72, and the charge pump circuit 77 is cut off, establishing the shutdown state. Also, when a register value that instructs shutdown is set in the shutdown setting register 79, the discharging-system control circuit 73 stops operation and sets the shutdown state.

Note that the configuration of the shutdown circuit 75 is not limited to FIG. 8. For example, instead of separately providing the switch SWSD, shutdown may be performed within each of the excessive discharge detection circuit 78, the regulator 72, and the charge pump circuit 77. For example, a configuration may be adopted in which a bias current of a comparator of the excessive discharge detection circuit 78 is switched off, a bias current of an amplifier circuit of the regulator 72 is switched off, and all of the switches of the charge pump circuit 77 are switched off.

In the shutdown state as described above, the discharge path from the battery 90 can be cut off. Therefore, the battery 90 is discharged only by natural discharge and a slight leakage current, so the period until the battery 90 reaches excessive discharge can be lengthened.

Note that although this embodiment has been described in detail above, it will be easily understood by those skilled in the art that many modifications that do not substantially deviate from novel matters and effects of the invention are possible. Accordingly, all such modifications are encompassed by the present invention. For example, in the specification or the drawings, a term described at least once together with a different term having a broader or equivalent meaning can be replaced with the different term at any point in the specification or the drawings. Also, all combinations of this embodiment and modifications are encompassed by the present invention. Also, the configuration, operation, and the like of the control device on the power receiving side, the power receiving device, the control device on the power transmission side, the power transmission device, the contactless power transmission system, and the electronic device are not limited to those described in this embodiment, and various modified embodiments are possible.

What is claimed is:

1. A control device that controls a power receiving device that receives electric power supplied from a power transmission device by a contactless power transmission, the control device comprising:
   a charging-system circuit that receives electric power supplied from the power transmission device, and charges a charging subject based on the received electric power; and
   a discharging-system circuit that operates based on electric power from the charging subject, and supplies power to a processing device based on electric power from the charging subject,
   wherein the charging-system circuit has a charging-system control circuit that operates based on electric power received by the charging-system circuit, and
   the charging-system control circuit is configured to receive a shutdown release notification sent from the power transmission device after the power receiving device is docked to the power transmission device, and based on the shutdown release notification, release a shutdown state in which discharge from the charging subject is stopped.

2. The control device according to claim 1,
   wherein the charging-system circuit has a communications circuit that sends authentication information to the power transmission device after the power receiving device is docked to the power transmission device, and
   the charging-system control circuit receives the shutdown release notification sent after the power transmission device receives the authentication information.

3. The control device according to claim 2,
   wherein the charging-system control circuit, when a charging start notification sent after the power transmission device receives the authentication information has been received, releases the shutdown state using the charging start notification as the shutdown release notification, and performs a control so as to start charging the charging subject.

4. The control device according to claim 1,
   wherein the charging-system circuit has a measurement circuit that measures a voltage of the charging subject, and
   the charging-system control circuit releases the shutdown state when the shutdown release notification is received, and also the voltage of the charging subject measured by the measurement circuit is higher than a threshold voltage corresponding to an excessively discharged state.

5. The control device according to claim 4,
   wherein the discharging-system circuit including:
   an excessive discharge detection circuit that detects the excessively discharged state of the charging subject by comparing the voltage of the charging subject with an excessive discharge detection voltage for detecting excessive discharge of the charging subject; and
   a discharging-system control circuit that operates based on electric power from the charging subject,
   wherein the discharging-system control circuit sets the discharging-system circuit to the shutdown state when the excessive discharge detection circuit has detected the excessively discharged state, and
   the threshold voltage is a voltage higher than the excessive discharge detection voltage.

6. The control device according to claim 4,
   wherein the discharging-system circuit including:
   an interface circuit that communicates with the processing device;
   an excessive discharge detection circuit that detects the excessively discharged state of the charging subject by comparing the voltage of the charging subject with an excessive discharge detection voltage; and
   a discharging-system control circuit that operates based on electric power from the charging subject,
   wherein the discharging-system control circuit sets the discharging-system circuit to the shutdown state when the interface circuit has received a shutdown command from the processing device, or when the charging-system control circuit has received a shutdown command from the power transmission device, or when the excessive discharge detection circuit has detected the excessively discharged state.

7. A power receiving device, comprising:
   the control device according to claim 1.

8. An electronic device, comprising:
   the control device according to claim 1.

9. A control device that controls a power receiving device that receives electric power supplied from a power transmission device by a contactless power transmission, the control device comprising:
   a charging-system circuit that receives electric power supplied from the power transmission device, and charges a charging subject based on the received electric power; and
   a discharging-system circuit that operates based on electric power from the charging subject, and supplies power to a processing device based on electric power from the charging subject,
   wherein the charging-system circuit has a charging-system control circuit that operates based on electric power received by the charging-system circuit during the charging, and
   a measurement circuit that measures a voltage of the charging of the charging subject, when the measured voltage is higher than a threshold voltage corresponding to an excessively discharged state, the charging-system control circuit releases a shutdown state in which discharge from the charging subject is stopped.

10. The control device according to claim 9,
    wherein the discharging-system circuit including:
    an excessive discharge detection circuit that detects the excessively discharged state of the charging subject by comparing the voltage of the charging subject with an excessive discharge detection voltage; and
    a discharging-system control circuit that operates based on electric power from the charging subject,
    wherein the discharging-system control circuit sets the discharging-system circuit to the shutdown state when the excessive discharge detection circuit has detected the excessively discharged state, and the threshold voltage is a voltage higher than the excessive discharge detection voltage.

11. A contactless power transmission system, comprising:
a control device on a power transmission side that controls a power transmission device; and
a control device on a power receiving side that controls a power receiving device that receives electric power supplied from the power transmission device by a contactless power transmission,
wherein the control device on the power receiving side has a charging-system circuit that receives electric power supplied from the power transmission device, and charges a charging subject based on the received electric power, and
a discharging-system circuit that operates based on electric power from the charging subject, and supplies power to a processing device based on electric power from the charging subject,
the control device on the power transmission side sending a shutdown release notification to the control device on the power receiving side when detected that the power receiving device is docked to the power transmission device, and
the control device on the power receiving side, when the shutdown release notification has been received, releasing a shutdown state in which discharge from the charging subject is stopped.

12. A control method of a contactless power transmission system including a control device on a power transmission side that controls a power transmission device, and a control device on a power receiving side that controls a power receiving device that receives electric power supplied from the power transmission device by a contactless power transmission, the method comprising:
the control device on the power transmission side sending a shutdown release notification to the control device on the power receiving side when detected that the power receiving device is docked to the power transmission device;
the control device on the power receiving side, when the shutdown release notification has been received, releasing a shutdown state in which discharge from the charging subject is stopped; and
the control device on the power receiving side receiving electric power supplied from the power transmission device, charging the charging subject based on the received electric power, and supplying power to a processing device based on electric power from the charging subject.

* * * * *